United States Patent
Han

(10) Patent No.: US 7,880,292 B2
(45) Date of Patent: Feb. 1, 2011

(54) SEMICONDUCTOR DEVICE AND FABRICATING METHOD THEREOF

(75) Inventor: Jae-Won Han, Gyeongi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 739 days.

(21) Appl. No.: 11/831,515

(22) Filed: Jul. 31, 2007

(65) Prior Publication Data

US 2008/0048345 A1    Feb. 28, 2008

(30) Foreign Application Priority Data

Aug. 23, 2006    (KR) .................... 10-2006-0080135

(51) Int. Cl.
*H01L 23/48*    (2006.01)
(52) U.S. Cl. ............... 257/698; 257/784; 257/E23.01; 438/679
(58) Field of Classification Search ............. 257/698, 257/774; 438/629, 686, 687, 685, 680, 679; 258/698, 774, E23.01
See application file for complete search history.

(56) References Cited

U.S. PATENT DOCUMENTS

| | | | | |
|---|---|---|---|---|
| 4,348,253 A | * | 9/1982 | Subbarao et al. | 438/667 |
| 6,429,509 B1 | * | 8/2002 | Hsuan | 257/690 |
| 6,768,205 B2 | * | 7/2004 | Taniguchi et al. | 257/774 |
| 7,183,654 B2 | * | 2/2007 | Opheim | 257/775 |

\* cited by examiner

*Primary Examiner*—Roy K Potter
(74) *Attorney, Agent, or Firm*—Sherr & Vaughn, PLLC

(57) ABSTRACT

A semiconductor device that allows an image sensor (in an upper area of a SiP semiconductor device) to exchange signals with a device in a lower area of a SiP semiconductor device. A semiconductor device includes at least one of: A semiconductor substrate having a photodiode area and a transistor area. A PMD (Pre Metal Dielectric) layer formed on and/or over the semiconductor substrate. At least one metal layers formed on and/or over the PMD layer. A first penetrating electrode penetrating the PMD layer and the at least one metal layers. A second penetrating electrode penetrating the semiconductor substrate and connected to the first penetrating electrode.

18 Claims, 5 Drawing Sheets

SEMICONDUCTOR DEVICE AND FABRICATING METHOD THEREOF

The present application claims priority under 35 U.S.C. 119 to Korean Patent Application No. 10-2006-0080135 (filed on Aug. 23, 2006), which is hereby incorporated by reference in its entirety.

BACKGROUND

Figure 1:
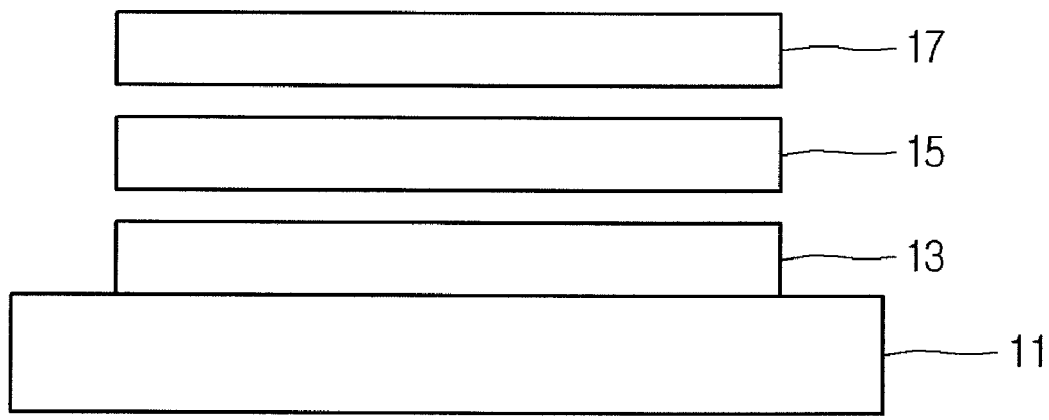

Example FIG. 1 is a diagram illustrating a SiP (System In a Package) semiconductor device that may be fabricated. An SiP may include interposer 11, first device 13, second device 15, and/or third device 17. For example, each first device 13, second device 15, and third device 17 may be one of a central processing unit (CPU), a static random access memory (SRAM), a dynamic random access memory (DRAM), a flash memory, a logic large scale integration (Logic LSI), a power integrated circuit (Power IC), a control integrated circuit (Control IC), an analog LSI, a monolithic microwave integrated circuit (MM IC), a complementary metal oxide semiconductor radio frequency IC (CMOS RF-IC), a sensor Chip, a micro electro mechanical system (MEMS) chip, and/or other semiconductor device.

In order for different devices to communicate in a SiP, connections may be formed between devices (e.g. between first device 13 and second device 15 and/or second device 15 and third device 17). Image sensors may be integrated into a SiP semiconductor device. An image sensor may receive light and generates electric signals based on the received light. An image sensor may be a semiconductor device that converts an optical image into an electric signal. An image sensor may be integrated into an upper area of a SiP semiconductor device, due to exposure of the upper area to external light. An image sensor may exchange signals with a device at a lower area of a SiP semiconductor. Accordingly, it may be necessary to have a way to electrically connect an image sensor (on an upper area of a SiP device) with a device at a lower area of the SiP semiconductor device.

SUMMARY

Embodiments relate to a semiconductor device that allows an image sensor (in an upper area of a SiP semiconductor device) to exchange signals with a device in a lower area of a SiP semiconductor device and a fabricating method thereof. In embodiments, a semiconductor device includes at least one of: A semiconductor substrate having a photodiode area and a transistor area. A PMD (Pre Metal Dielectric) layer formed on and/or over the semiconductor substrate. At least one metal layers formed on and/or over the PMD layer. A first penetrating electrode penetrating the PMD layer and the at least one metal layers. A second penetrating electrode penetrating the semiconductor substrate and connected to the first penetrating electrode.

In embodiments, a method of fabricating a semiconductor device includes at least one of: Forming a semiconductor substrate having a photodiode area and a transistor area. Forming a PMD (Pre Metal Dielectric) layer on and/or over the semiconductor substrate. Forming at least one metal layer on and/or over the PMD layer. Forming a first penetrating electrode to penetrate the at least one metal layer and the PMD layer. Forming a second penetrating electrode to penetrate the semiconductor substrate and connect to the first penetrating electrode.

In embodiments, a semiconductor device includes an image sensor including at least one of: A semiconductor substrate having a photodiode area and a transistor area. A PMD (Pre Metal Dielectric) layer formed on and/or over the semiconductor substrate. At least one metal layer formed on and/or over the PMD layer. A first penetrating electrode penetrating the PMD layer and the at least one metal layer. A second penetrating electrode penetrating the semiconductor substrate and connected to the first penetrating electrode. A second device formed under the image sensor. A connecting layer formed between the image sensor and the second device that electrically connects the second penetrating electrode of the image sensor and a circuit electrode of the second device.

DRAWINGS

Example FIG. 1 illustrates a SiP (System In a Package) semiconductor device.

Example FIGS. 2 to 6 illustrate methods of fabricating an image sensor, according to embodiments.

Figure 7:
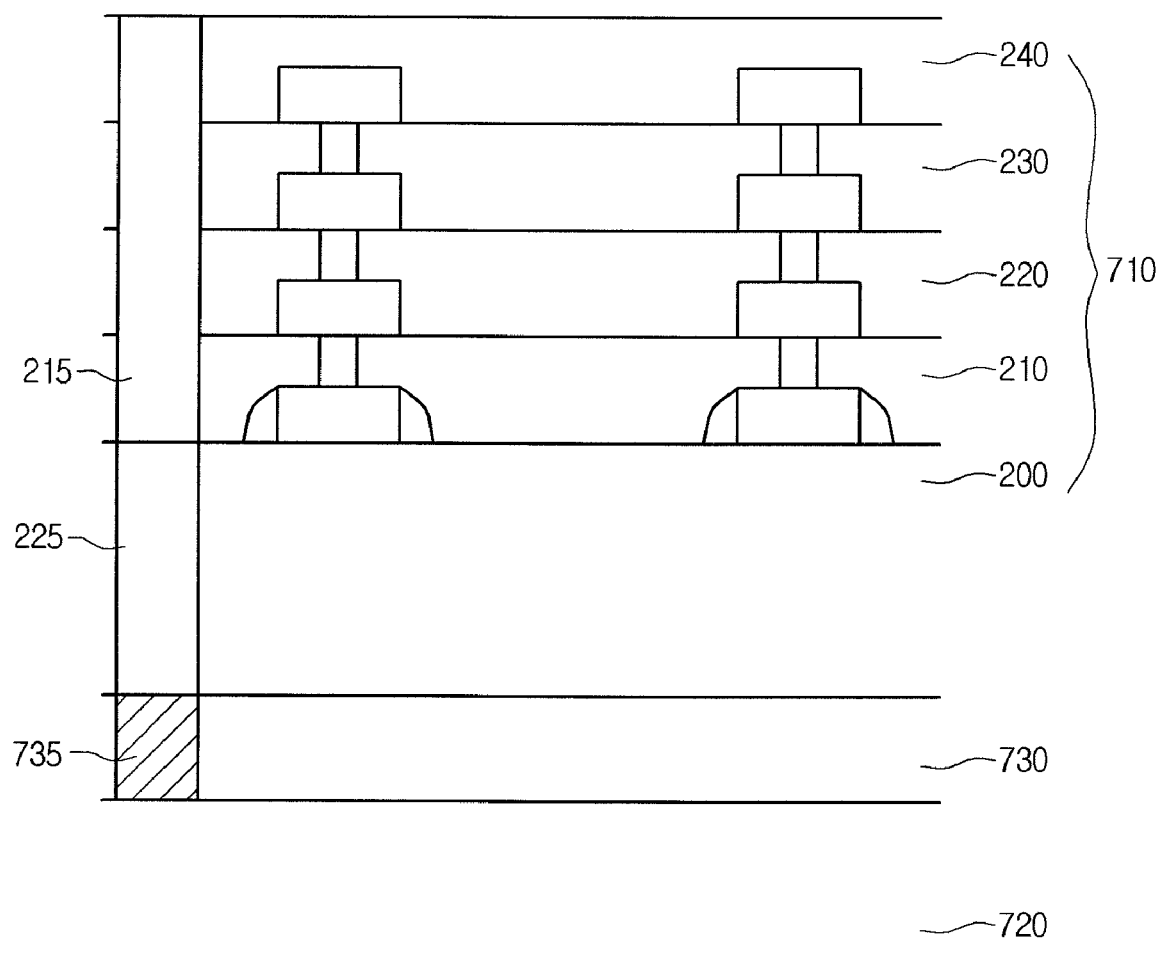

Example FIG. 7 illustrates a SiP (System In a Package) semiconductor device, in accordance with embodiments.

DESCRIPTION

Figure 2:
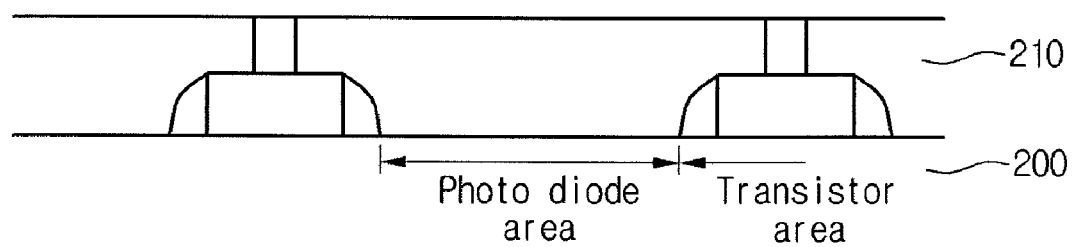

Example FIG. 2 illustrates semiconductor substrate 200 having a photo diode area and/or a transistor area, in accordance with embodiments. A pre metal dielectric (PMD) layer 210 may be formed on and/or over semiconductor substrate 200. The photo diode area and/or the transistor area may be formed in the upper area of a semiconductor device. At least one contact may be formed in PMD layer 210.

Figure 3:
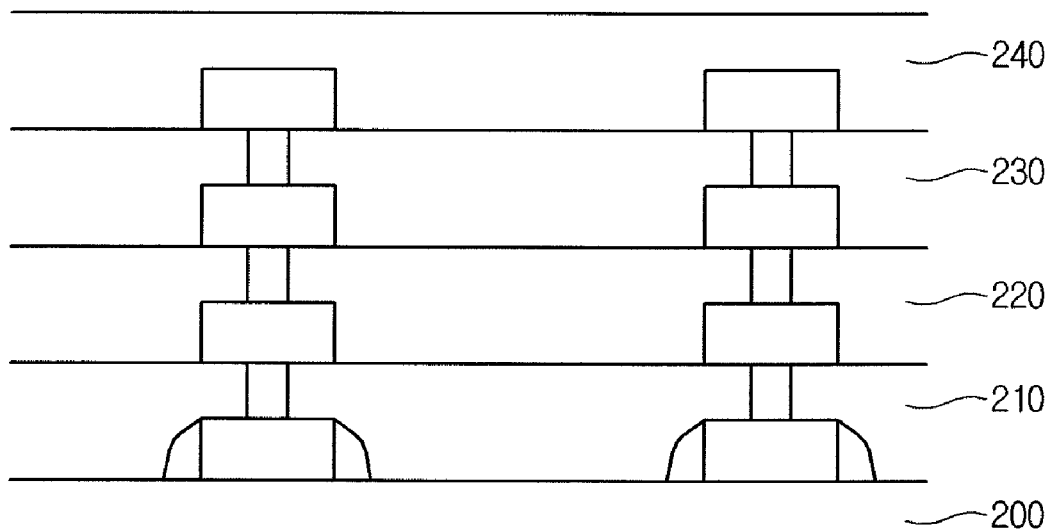

Example FIG. 3 illustrates at least one metal wiring layer (e.g. first metal wiring layer 220, second metal wiring layer 230, and third metal wiring layer 240) formed on and/or over PMD layer 210, in accordance with embodiments. Although example FIG. 3 illustrates multiple metal wiring layers formed on and/or over PMD layer 210, there may be any number of the metal layers (including only a single metal layer), in different embodiments. In embodiments, a metal wiring layer may include a dielectric layer, trenches, vias, conductive plugs, wiring patterns, and other structures that one of ordinary skill in the art would recognize as being part of a metal wiring layer.

Figure 4:
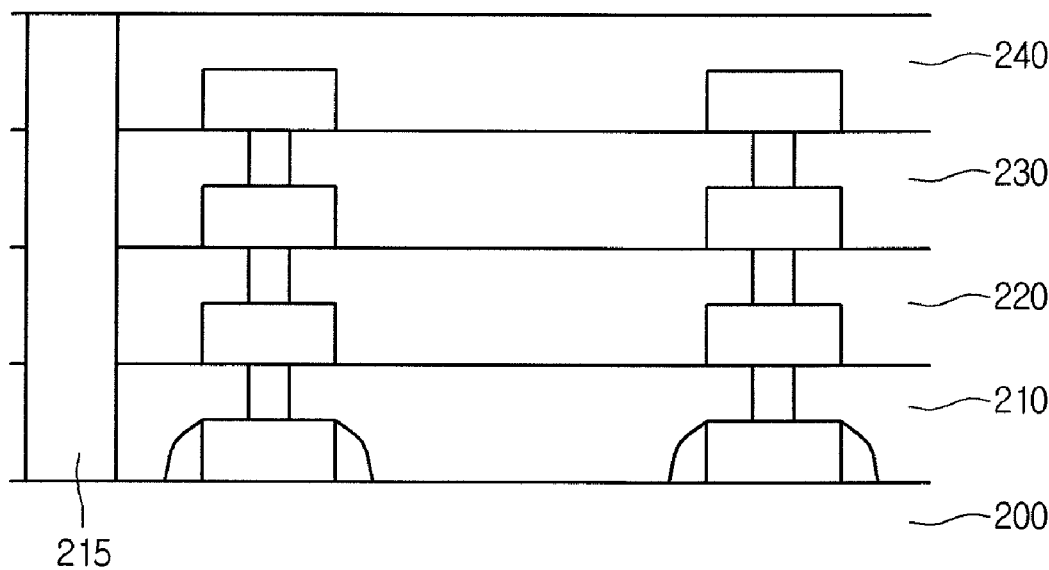

Example FIG. 4 illustrates first penetrating electrode 215 penetrating the third metal wiring layer 240, second metal wiring layer 230, first metal layer 220, and PMD layer 210, in accordance with embodiments. First penetrating electrode 215 may extend to a surface of semiconductor substrate 200. First penetrating electrode 215 may be formed by sequentially performing a patterning process, an etching process, and a metal forming process on each of the third metal wiring layer 240, the second metal wiring layer 230, the first metal layer 220, and the PMD layer 210, in accordance with embodiments. First penetrating electrode 215 may be made of at least one of W, Cu, Al, Ag, and Au. In embodiments, first penetrating electrode 215 may be deposited using at least one of CVD (chemical vapor deposition), PVD (physical vapor deposition), an evaporation process, ECP (electro chemical plating), and other similar processes appreciated by one of ordinary skill. In embodiments, first penetrating electrode 215 include a barrier metal. A barrier metal may be at least one of TaN, Ta, TiN, Ti, TiSiN, and other similar materials appreciated by one of ordinary skill, in accordance with embodiments. A barrier metal may be formed using at least one of CVD, PVD, ALD (atomic layer deposition), and other processes appreciated by one of ordinary skill.

After forming the first penetrating electrode 215, post processing may be required to fabricate an image sensor, in accordance with embodiments. For example, a color filter and/or a micro lens may be formed on and/or over third metal layer 240. A color filter may selectively transmit light (of predetermined wavelengths) to a photodiode area formed on the semiconductor substrate. A micro lens may concentrates the light.

Figure 5:
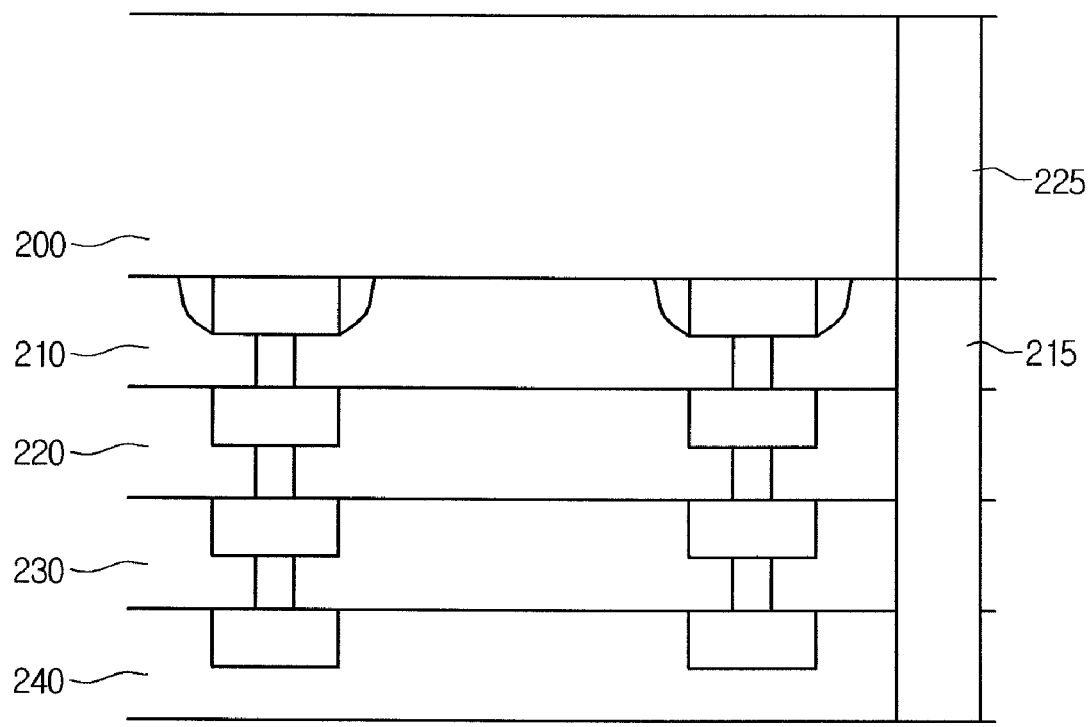
Figure 6:
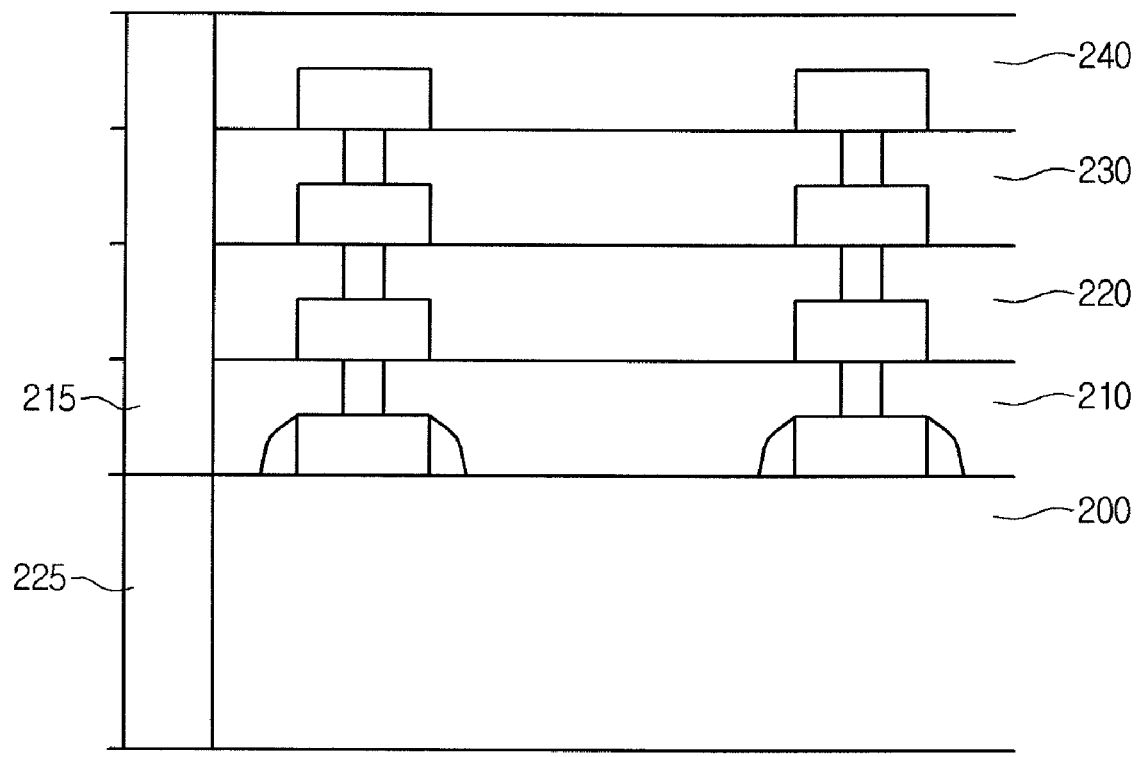

Example FIGS. 5 and 6 illustrate a second penetrating electrode 225. Second penetrating electrode 225 may penetrate semiconductor substrate 200 and may connect to first penetrating electrode 215. Second penetrating electrode 225 may be formed by sequentially performing a patterning process, an etching process, and a metal forming process on substrate 200. In embodiments, the patterning process, the etching process, and the metal forming process may be performed by flipping substrate 200 upside down as illustrate in FIG. 5. In other words, second penetrating electrode may be formed by performing processing steps on the opposite side of substrate 200 than the processing steps that formed first penetrating electrode 215, in accordance with embodiments.

In embodiments, second penetrating electrode 225 may be made of at least one of W, Cu, Al, Ag, Au, and other similar material appreciated by one of ordinary skill. Second penetrating electrode 225 may be deposited using at least one of CVD (chemical vapor deposition), PVD (physical vapor deposition), an evaporation process, ECP (electro chemical plating), and other processes appreciated by one of ordinary skill. In embodiments, second penetrating electrode 225 may include a barrier metal. A barrier metal may include at least one of TaN, Ta, TiN, Ti, TiSiN, and other similar material appreciated by one of ordinary skill. In embodiments, second penetrating electrode 225 may be formed by at least one of CVD, PVD, ALD, and other similar processes appreciated by one of ordinary skill.

In embodiments, the bottom semiconductor substrate 200 may be grinded to reduce the thickness of substrate 200. In embodiments, when the thickness of substrate 200 is reduced, it may be easier to form second penetrating electrode 225. In embodiments, the thickness of semiconductor substrate 200 may be reduced by grinding the bottom side of semiconductor substrate 200 during a metal forming process of forming second penetrating electrode 225.

As illustrated in example FIG. 7, an image sensor may be stacked with other devices in a SiP semiconductor device, in accordance with embodiments. In embodiments, a SiP semiconductor device may include image sensor 710, second device 720, and/or connecting layer 730. Connecting layer 730 may electrically connect image sensor 710 and second device 720, in accordance with embodiments.

In embodiments, image sensor 710 may includes at least one of: A semiconductor substrate 200 having a photo diode area and a transistor area. A PMD (pre metal dielectric) layer 210 formed on and/or over semiconductor substrate 200. At least one of first metal wiring layer 220, second metal wiring layer 230, and third metal wiring layer 240 formed on and/or over PMD layer 210. First penetrating electrode 215 penetrating at least one of first metal wiring layer 220, second metal wiring layer 230, third metal wiring layer 240, and PMD layer 210. Second penetrating electrode 225 penetrating semiconductor substrate 200, which may be connected to first penetrating electrode 215.

Second device 720 may be electrically connected to image sensor 710 through connecting layer 730, in accordance with embodiments. Connecting layer 730 may have a connecting electrode 735 for electrically connecting image sensor 710 (through second penetrating electrode 225) to a circuit electrode of second device 720. In embodiments, second device 720 may be at least one of a central processing unit (CPU), static random access memory (SRAM), dynamic random access memory (DRAM), flash memory, logic large scale integration (Logic LSI), a power integrated circuit (Power IC), a control integrated circuit (Control IC), an analog LSI, a monolithic microwave integrated circuit (MM IC), a complementary metal oxide semiconductor radio frequency IC (CMOS RF-IC), a sensor Chip, a micro electro mechanical system (MEMS) chip, and other devices appreciated by one of ordinary skill.

In embodiments, first penetrating electrode 215 and the 225 of image sensor 710 may electrically connect image sensor 710 at an upper, exposed area a SiP semiconductor device with a second device 720 formed below image sensor 710. Accordingly, first penetrating electrode 215 and second penetrating electrode 225 may allow image sensor 710 to exchange signals with second device 720.

Although embodiments have been described with reference to a number of illustrative embodiments thereof, it should be understood that numerous other modifications and embodiments can be devised by those skilled in the art that will fall within the spirit and scope of the principles of the disclosed embodiments. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
  a semiconductor substrate;
  at least one layer formed over the semiconductor substrate;
  a first penetrating electrode formed through said at least one layer; and
  a second penetrating electrode formed through the semiconductor substrate, wherein the first penetrating electrode contacts the second penetrating electrode,
  wherein said at least one layer comprises at least one dielectric layer.

2. The apparatus of claim 1, wherein said at least one dielectric layer is a pre metal dielectric layer.

3. The apparatus of claim 1, wherein said at least one layer comprises at least one metal wiring layer.

4. The apparatus of claim 1, wherein the semiconductor substrate comprises at least one of a photodiode area and a transistor area.

5. The apparatus of claim 1, wherein at least one of the first penetrating electrode and the second penetrating electrode comprises at least one of W, Cu, Al, Ag, and Au.

6. The apparatus of claim 1, comprising a color filter formed over said at least one layer, wherein the color filter is configured to transmit select wavelengths of light.

7. The apparatus of claim 6, comprising a micro lens formed over the color filter.

8. The apparatus of claim 1 comprising:
  a first device formed on a first side of the semiconductor substrate; and
  a second device arranged over a second side of the semiconductor substrate, wherein the first device and the second device are electrically coupled by the first penetrating electrode and the second penetrating electrode.

9. The apparatus of claim 8, wherein the first device is an image sensor.

10. The apparatus of claim 8, wherein the second device is at least one of:
  a central processing unit;
  static random access memory;

dynamic random access memory;
flash memory;
logic large scale integration;
a power integrated circuit;
a control integrated circuit;
an analog LSI;
monolithic microwave integrated circuit;
a complementary metal oxide semiconductor radio frequency integrated circuit;
a sensor chip; and
a micro electro mechanical system chip.

11. A method comprising:
forming at least one layer over a semiconductor substrate;
forming a first penetrating electrode through said at least one layer; and
forming a second penetrating electrode through the semiconductor substrate, wherein the first penetrating electrode contacts the second penetrating electrode,
wherein said forming at least one layer comprises forming at least one dielectric layer.

12. The method of claim 11, wherein said forming at least one layer comprises forming at least one metal wiring layer.

13. The method of claim 11, comprising forming at least one of a photodiode area and a transistor area in the semiconductor substrate.

14. The method of claim 11, wherein at least one of the first penetrating electrode and the second penetrating electrode comprises at least one of W, Cu, Al, Ag, and Au.

15. The method of claim 11, comprising forming a second device on an opposite side of the semiconductor substrate as said at least one layer.

16. The method of claim 11, wherein the second penetrating electrode is formed after flipping the semiconductor substrate over.

17. The method of claim 11, wherein said forming the second penetrating electrode comprises grinding a bottom side of the semiconductor substrate to reduce the thickness of the semiconductor substrate.

18. The method of claim 11, wherein at least one of forming the first penetrating electrode and forming the second penetrating electrode comprises at least one of:
chemical vapor deposition;
physical vapor deposition;
an evaporation process; and
electro chemical plating.

* * * * *